United States Patent
Cao et al.

(10) Patent No.: US 11,000,120 B2
(45) Date of Patent: May 11, 2021

(54) MODULAR ACCESSORY UNIT

(71) Applicant: HEWLETT-PACKARD DEVELOPMENT COMPANY, L.P., Spring, TX (US)

(72) Inventors: Zheng Cao, Spring, TX (US); Dimitre Mehandjiysky, Spring, TX (US); Kevin L. Massaro, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 19 days.

(21) Appl. No.: 16/335,073

(22) PCT Filed: Sep. 29, 2016

(86) PCT No.: PCT/US2016/054407
§ 371 (c)(1),
(2) Date: Mar. 20, 2019

(87) PCT Pub. No.: WO2018/063235
PCT Pub. Date: Apr. 5, 2018

(65) Prior Publication Data
US 2019/0208902 A1    Jul. 11, 2019

(51) Int. Cl.
*A47B 21/007*      (2006.01)
*G09F 3/00*        (2006.01)
(Continued)

(52) U.S. Cl.
CPC .......... *A47B 21/007* (2013.01); *A47B 13/088* (2013.01); *A47B 87/002* (2013.01);
(Continued)

(58) Field of Classification Search
CPC . A47B 21/007; A47B 13/099; G06F 3/04883; G09F 3/00; H05K 5/0221; H05K 5/0234; H05K 5/0247
(Continued)

(56) References Cited

U.S. PATENT DOCUMENTS 2,827,955 A * 3/1958 Hurley ................... G03B 21/58
                                                     160/369
3,342,147 A * 9/1967 Shettles ............... A47B 87/002
                                                     108/64
(Continued)

FOREIGN PATENT DOCUMENTS

CN         1421027         5/2003
CN         103955308       7/2014
(Continued)

OTHER PUBLICATIONS

An Office System That Turns Every Desk into a Conference Room, Jun. 13, 2013, < Http://www.fastcodesign.com/1672809/an-office-system-that-turns-every-desk-into-a-conference-room >.
(Continued)

*Primary Examiner* — Paul R. Myers
(74) *Attorney, Agent, or Firm* — Michael A. Dryja

(57) ABSTRACT

An example display system is disclosed. The modular accessory system comprises a display unit, and a base attached to the display unit. The base comprises a communication interface to establish a connection between the display unit of the modular accessory system and at least one other display unit of another modular accessory system. The modular accessory system also comprises a stand attached to the base, and the stand holds a power cable to power the modular accessory system.

14 Claims, 3 Drawing Sheets

(51) Int. Cl.
  *A47B 87/00* (2006.01)
  *A47B 13/08* (2006.01)
  *G06F 3/0488* (2013.01)
  *H05K 5/02* (2006.01)
(52) U.S. Cl.
  CPC ............ *G06F 3/04883* (2013.01); *G09F 3/00* (2013.01); *H05K 5/0221* (2013.01); *H05K 5/0234* (2013.01); *H05K 5/0247* (2013.01); *A47B 2021/0076* (2013.01); *A47B 2200/0082* (2013.01); *A47B 2200/0084* (2013.01)
(58) Field of Classification Search
  USPC .......................................................... 710/106
  See application file for complete search history.

(56) References Cited

U.S. PATENT DOCUMENTS

| | | | |
|---|---|---|---|
| 6,247,815 B1 | 6/2001 | Inova | |
| 8,672,736 B1* | 3/2014 | Nicely | G07F 17/32 273/292 |
| 9,084,489 B2 | 7/2015 | Gosling et al. | |
| 9,282,814 B2 | 3/2016 | Riley et al. | |
| 2002/0005818 A1* | 1/2002 | Bruzzone | G06F 1/1616 345/6 |
| 2003/0016211 A1 | 1/2003 | Woolley | |
| 2004/0100448 A1 | 5/2004 | Moshrefzadeh | |
| 2006/0028398 A1 | 2/2006 | Willmore | |
| 2007/0069973 A1* | 3/2007 | Gerbacia | G09F 15/0075 345/1.1 |
| 2007/0153461 A1* | 7/2007 | Singh | G06F 1/1635 361/679.11 |
| 2008/0143637 A1* | 6/2008 | Sunahara | G09G 3/2096 345/1.1 |
| 2009/0266274 A1* | 10/2009 | Berlin | A47B 9/20 108/6 |
| 2009/0322767 A1* | 12/2009 | Douglas | G09G 5/006 345/520 |
| 2010/0023895 A1* | 1/2010 | Benko | G06F 3/042 715/863 |
| 2012/0007814 A1* | 1/2012 | Tung | G06F 1/1652 345/173 |
| 2012/0038619 A1* | 2/2012 | Shraga | H02J 50/40 345/212 |
| 2012/0050223 A1* | 3/2012 | Wu | G06F 1/181 345/175 |
| 2012/0111491 A1 | 5/2012 | Huang et al. | |
| 2012/0162351 A1* | 6/2012 | Feldman | G06F 3/1423 348/14.03 |
| 2012/0235964 A1* | 9/2012 | Kim | G09G 3/20 345/204 |
| 2012/0312199 A1* | 12/2012 | Johnson | A47B 21/0073 108/50.11 |
| 2013/0176496 A1* | 7/2013 | Sisto | H04N 9/67 348/660 |
| 2013/0232833 A1* | 9/2013 | Davis | G09F 19/22 40/600 |
| 2014/0164918 A1* | 6/2014 | Nicolas | G06F 3/0421 715/704 |
| 2014/0192530 A1* | 7/2014 | Liu | G09F 9/301 362/249.02 |
| 2014/0361980 A1* | 12/2014 | Iwaki | G06F 3/14 345/156 |
| 2015/0287390 A1* | 10/2015 | Kakeko | H04L 67/10 345/1.1 |
| 2015/0338911 A1* | 11/2015 | Yamamoto | G06F 3/1446 713/323 |
| 2016/0028042 A1* | 1/2016 | Lee | G02F 1/133305 361/749 |
| 2016/0062725 A1* | 3/2016 | Odagiri | G06F 3/1446 345/1.3 |
| 2016/0224306 A1* | 8/2016 | Rycyna, III | G09G 3/32 |
| 2016/0357493 A1* | 12/2016 | Zerwas | G06F 3/1438 |
| 2017/0024179 A1* | 1/2017 | Terao | G06F 3/1438 |
| 2017/0185170 A1* | 6/2017 | Magi | G06F 3/0483 |
| 2017/0201607 A1* | 7/2017 | Xu | H04M 1/0216 |
| 2017/0330237 A1* | 11/2017 | Canceri | G06K 9/6218 |
| 2018/0126283 A1* | 5/2018 | Yates | A63F 13/2145 |

FOREIGN PATENT DOCUMENTS

| | | |
|---|---|---|
| CN | 203828390 U | 9/2014 |
| CN | 203986703 U | 12/2014 |
| CN | 105336043 | 2/2016 |
| CN | 105768558 A | 7/2016 |
| KR | 20110075887 | 7/2011 |
| WO | WO-2011041113 | 4/2011 |
| WO | WO-2016018414 | 2/2016 |

OTHER PUBLICATIONS

Five of the Best Smart Desks for Your Home Office, May 2016, < Http://housely.com/home-office-smart-desks/ >.

* cited by examiner

MODULAR ACCESSORY UNIT

BACKGROUND

With the recent development, the number of devices used by one or more people in one space has increased significantly. Along with that, the demand for larger screens to view the content has also increased, especially in an office space where the employees are constantly collaborating with each other through these screens. An organization may configure its office space in a desirable layout with desirable furniture to be able to provide the most effective and efficient collaboration environment for its employees.

BRIEF DESCRIPTION OF THE DRAWINGS

Examples are described in the following detailed description and in reference to the drawings, in which.

DETAILED DESCRIPTION

Various aspects of the present disclosure are directed to a modular accessory system. More specifically, and as described in greater detail below, various aspects of the present disclosure are directed to a manner by which devices operating in same or different operating systems may be displayed on one extendable screen through modular smart surfaces that can be attached to each other.

Aspects of the present disclosure described herein disclose allowing the user to display content on a smart surface of furniture (e.g., desk in an office, table in a conference room). Among other things, this approach allows collaboration between users through one screen across multiple attached surfaces. The user can use touch gestures to control the display. Moreover, aspects of the present disclosure described herein allow utilizing office furniture with embedded display and/or computing technologies. Among other things, this approach may provide the flexibility of avoiding additional expense to move stationary furniture around and changing any existing configurations of an office layout easily. Moreover, when the display screen is adjusted in view angle, the screens can be viewed privately without allowing others to see or allowing full collaboration between users.

In one example in accordance with the present disclosure, a method for managing a plurality of modular accessory units is provided. The method comprises establishing, by a base of a modular accessory unit, connection between the modular accessory unit and at least one other modular accessory unit, wherein the modular accessory unit comprises a display unit and the base.

In another example in accordance with the present disclosure, a modular accessory system is provided. The modular accessory system comprises a display unit, and a base attached to the display unit. The base comprises a communication interface to establish a connection between the display unit of the modular accessory system and at least one other display unit of another modular accessory system. The modular accessory system also comprises a stand attached to the base, and the stand holds a power cable to power the modular accessory system.

In a further example in accordance with the present disclosure, a non-transitory computer readable medium is provided. The non-transitory computer-readable medium comprises instructions which, when executed, cause a device to (i) establish, by a base of the modular accessory system, a connection between a display unit of the modular accessory system and at least one other display unit of another modular accessory system; and (ii) display content seamlessly across the display unit and the at least one other display unit, wherein one portion of the content is displayed on the display unit and the other portion is displayed on the at least one other display unit.

Figure 1:
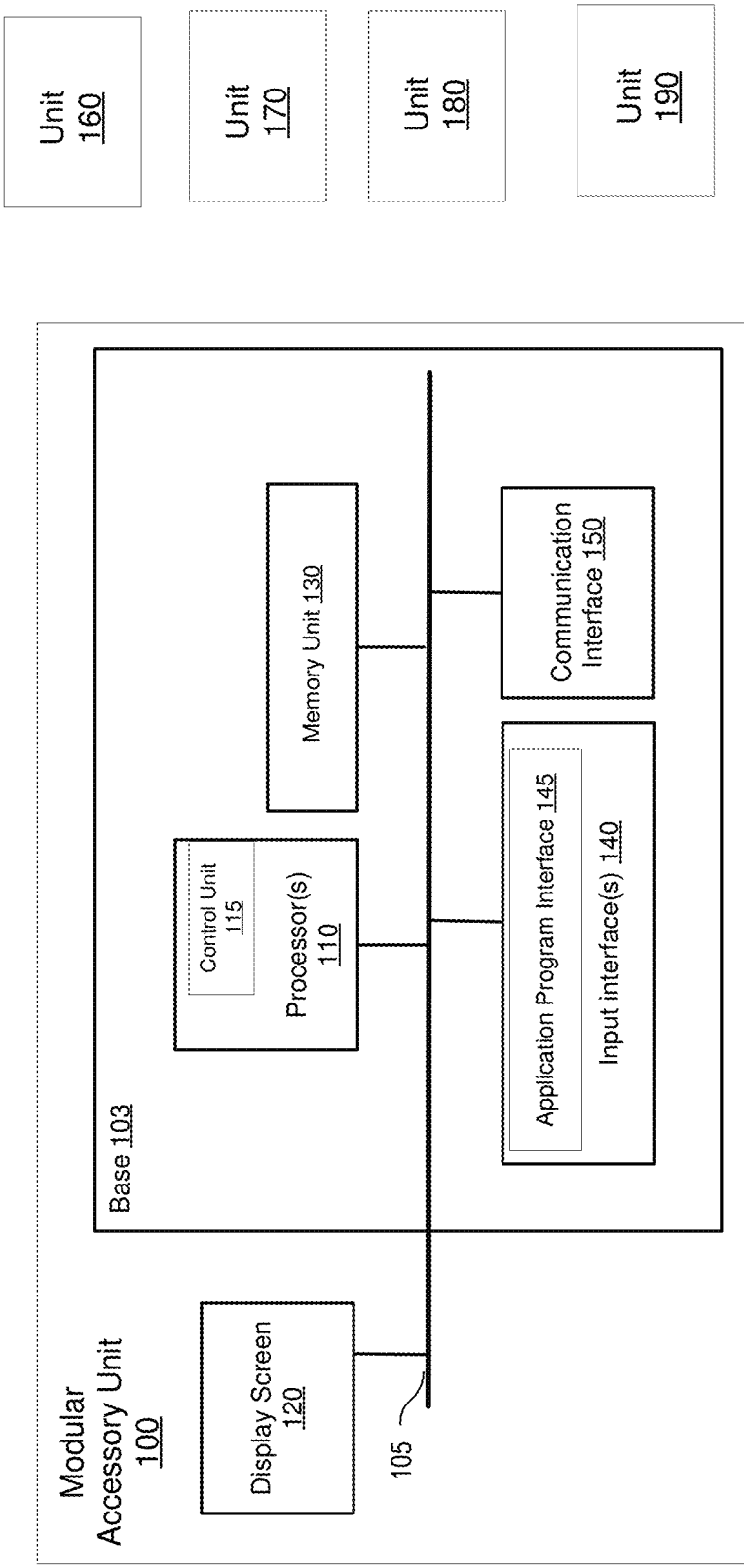
FIG. 1 illustrates a schematic representation of an example display unit in accordance with an implementation of the present disclosure.

FIG. 1 is a schematic representation of an example modular accessory unit 100 connected to a plurality of other modular accessory units 160-190. It should be readily apparent that the present illustration should not be interpreted to be limited by this particular illustrative architecture shown in FIG. 1, and the modular accessory unit 100 represents a generalized illustration and that other elements may be added or the illustrated elements may be removed, modified, or rearranged in many ways.

The modular accessory unit 100 may be a desk, table or any other similar furniture. The modular accessory unit 100 may be a highly modular furniture system for use in classrooms or office settings. The modular accessory unit 100 may be connected to other modular accessory units. The components are coupled to together to form a modular furniture system. In one implementation, which will be described in greater detail below, connectors, expansion slots, networking capabilities, and other storage units are provided within the furniture components enabling several electronic devices to be installed within the furniture components and communicate with each other. In another implementation, the connection between the modular accessory units may be wireless (e.g., no cables).

The modular accessory unit 100 includes a base 103 and a display screen 120. The modular accessory unit 100 may be pre-manufactured to be modular and incorporate the computer systems and electronics as shown and described herein in this disclosure. For example, the base 103 includes a processor 110 (e.g., a central processing unit, a microprocessor, a microcontroller, or another suitable programmable device), a memory unit 130, input interfaces 140, and a communication interface 150. Each of these components or any additional components of the modular accessory unit 100 is operatively coupled to a bus 105. The bus 105 may be any of several types of bus structures including a memory bus or memory controller, a peripheral bus, and a local bus using any of a variety of bus architectures. In other examples, the modular accessory unit 100 includes additional, fewer, or different components for carrying out similar functionality described herein. For example, the processor 110 and the memory unit 130 may be located outside of the modular accessory unit 100, and the modular accessory unit 100 may be connected to these computing components via a Wi-Fi® interface, a Bluetooth interface, a 3G interface, a 4G interface, a near filed communication (NFC) interface, and/or any other suitable interface. The computing components may comprise a computing device, which may include, but not limited to, any one of various desktops, laptops, tablets, smart phones, watches and other similar devices. The computing device may operate as a stationary computing device (e.g., personal computers (i.e., desktops), server computers, laptop computers (with permanently attached display screens), all in one devices, and other similar devices that possess comparable characteristics). In other implementations, these devices can be handheld devices, such as tablets and smart phones.

The processor 110 includes a control unit 112 and may be implemented using any suitable type of processing system where at least one processor executes computer-readable instructions stored in the memory 130. The processor 110 may be, for example, a central processing unit (CPU), a semiconductor-based microprocessor, an application specific integrated circuit (ASIC), a field-programmable gate array (FPGA) configured to retrieve and execute instructions, other electronic circuitry suitable for the retrieval and execution instructions stored on a computer readable storage medium (e.g., the memory 130), or a combination thereof.

The machine readable medium 130 may be a non-transitory computer-readable medium that stores machine readable instructions, codes, data, and/or other information. The instructions, when executed by processor 110 (e.g., via one processing element or multiple processing elements of the processor) can cause processor 110 to perform processes described herein. Further, the computer readable medium 130 may participate in providing instructions to the processor 110 for execution. The machine readable medium 130 may be one or more of a non-volatile memory, a volatile memory, and/or one or more storage devices. Examples of non-volatile memory include, but are not limited to, electronically erasable programmable read only memory (EEPROM) and read only memory (ROM). Examples of volatile memory include, but are not limited to, static random access memory (SRAM) and dynamic random access memory (DRAM). Examples of storage devices include, but are not limited to, hard disk drives, compact disc drives, digital versatile disc drives, optical devices, and flash memory devices. As discussed in more detail above, the processor 110 may be in data communication with the machine readable medium 130, which may include a combination of temporary and/or permanent storage. The machine readable medium 130 may include program memory that includes all programs and software such as an operating system, user detection software component, and any other application software programs. The machine readable medium 130 may also include data memory that may include multicast group information, various table settings, and any other data required by any element of the ASIC. The processor 110 includes a control unit 115 and may be implemented using any suitable type of processing system where at least one processor executes computer-readable instructions stored in the memory 130.

The communication interface 150 enables the modular accessory unit 100 to communicate with a plurality of networks and communication links. In some examples, the communication interface of the modular accessory unit 100 may include a Wi-Fi® interface, a Bluetooth interface, a 3G interface, a 4G interface, a near filed communication (NFC) interface, and/or any other suitable interface that allows the computing device to communicate via one or more networks. The networks may include any suitable type or configuration of network to allow the modular accessory unit 100 to communicate with any external systems or devices (e.g., the modular accessory units 160-190).

The input interfaces 140 can process information from the various external system, devices (e.g., the modular accessory units 160-190), and networks that are in communication with the modular accessory unit 100. For example, the input interfaces 140 include an application program interface 145. In other examples, the input interfaces 140 can include additional interfaces. More specifically, the application program interface 145 receives content or data (e.g., video, images, data packets, graphics, etc.) from the modular accessory units 160-190. In one implementation, the display screen 120 may allow for sharing of electronic content. For example, electronic content may be in the form of a video posted to a social media service and subsequently viewed and commented on by one or more users of that social media service. Further, the display may be used as a collaboration platform between a plurality of users. The display screen 120 of the modular accessory unit 100 may be merged with the display screens of the modular accessory units 160-190, and may act as a single display unit. The content may be expanded and shown across all the display screens as a whole.

The display screen 120 may be a transparent an organic light emitting diode (OLED) display, or any other suitable display. In one implementation, the display screen 120 comprises various display properties such as resolution, display pixel density, display orientation and/or display aspect ratio. The display screen 120 may be of different sizes and may support various types of display resolution, where display resolution is the number of distinct pixels in each dimension that can be displayed on the display screen 120. For example, the display screen 120 may support high display resolutions of 1920×1080, or any other suitable display resolutions. When the display screen supports a 1920×1080 display resolution, 1920 is the total number of pixels across the height of the display 120 and 1080 is the total number of pixels across the height of the display 120.

The base 103 comprises a connection system for the modular accessory unit 100 to be attached to other modular accessory units. In one implementation, the connection may be a mechanical mechanism (e.g., latch, magnet). For example, the modular accessory unit 100 may have a magnet connection, and the modular accessory unit 100 may slide into another modular accessory unit. Alternatively, the modular accessory unit 100 may have a latch, and the modular accessory unit 100 may snap into and be locked to another modular accessory unit via the latch. In another implementation, there may not be a mechanical connection. The modular accessory unit 100 may be connected to other modular accessory units wirelessly. Further, the connection may be electrical. In various implementations, the modular accessory unit 100 may have a variety of structural compositions (e.g., USB, DE-9, BNC) to electrically connected to other modular accessory units.

As discussed above, the modular accessory unit 100 may be connected to the other modular accessory units 160-190 via VGA, HDMI, USB Wi-Fi, Bluetooth, over the local network or over the internet cloud. For example, a receiver may be implemented on the modular accessory unit 100, and when the modular accessory unit 160 is moved within the NFC range, the modular accessory unit 100 may automatically detect the modular accessory unit 160 and pair with the modular accessory unit 160 initiating the display of the instance from the modular accessory unit 160 on the display screen 120. In another implementation, the modular accessory unit 100 may have a Bluetooth low energy beacon, which can be used to automatically recognize the devices (e.g., the modular accessory unit 160) within the Bluetooth zone. At that point, the modular accessory unit 100 may send a message to the modular accessory unit 160 to pair with it automatically. The modular accessory unit 160 may start to stream the instances of the modular accessory unit 160 on the modular accessory unit 100 after the modular accessory unit 160 is paired with the modular accessory unit 100. In a further implementation, the modular accessory unit 100 may be connected to the modular accessory unit 160 via a USB or HDMI connection.

Figure 2B:
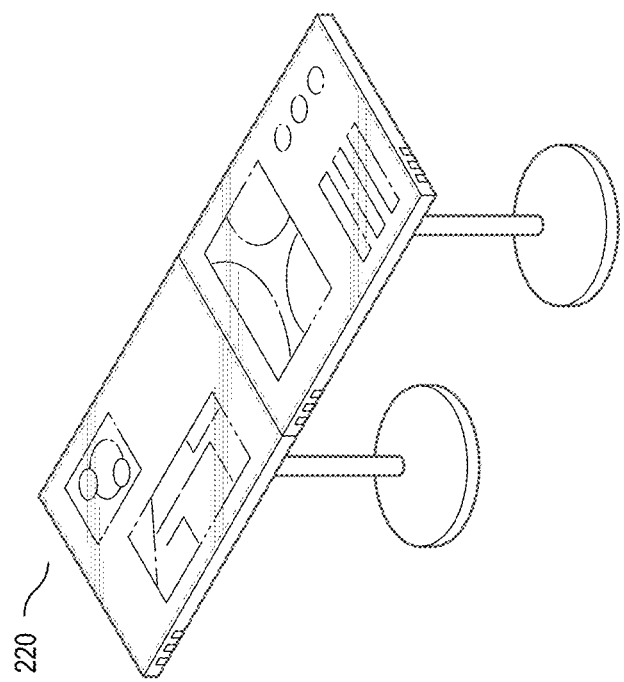
FIGS. 2A and 2B illustrate an example display unit in accordance with an implementation.
Figure 2A:
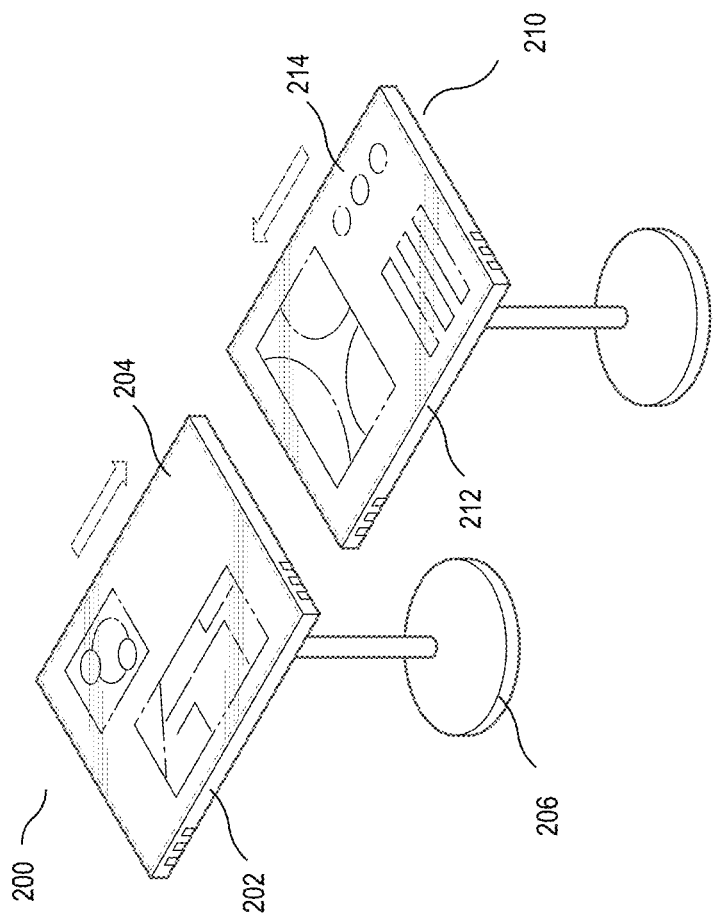

FIGS. 2A and 2B illustrate a modular accessory unit 200, according to an example. As illustrated in FIGS. 2A and 2B, the modular accessory unit 200 may include but are not limited to surfaces, legs and other supporting members which are not shown in FIGS. 2A and 2B, such as shelves, chairs, wheels, and other components commonly used in offices and classrooms today. It should be readily apparent that the present illustration should not be interpreted to be limited by this particular illustrative architecture shown in FIGS. 2A and 2B, and the display unit 200 represents a generalized illustration and that other elements may be added or the illustrated elements may be removed, modified, or rearranged in many ways. For example, two modular accessory units are shown to be connected as examples, and more number of instances may be shown in another implementation. In one implementation, the display units from a plurality of modular accessory units may be able to interact with each other through commands executed on the display units. This is enabled by software installed in or connected to the operating system of each modular accessory unit.

FIG. 2A illustrates a modular accessory unit 200 that includes a desk portion having a top surface. A display unit 204 is located within top surface of desk portion. Moreover, the modular accessory unit 200 comprises a base 202. Coupled to the display portion is the base portion 202, which includes a plurality of electronic components as well as room for other storage components. Together, the display portion and base portion form a shell for the modular accessory unit 200. Further, the shell is coupled to a stand (e.g. leg) 206, which houses a power cord, when plugged into a power source, provides power to the base 202 and the display unit 204. The stand 206 is positioned so that top surface is substantially planar and relatively flat, and in parallel to a floor. In one implementation, the top surface of the modular accessory unit may be made from an unscratchable, unbreakable, and heat resistant glass. Further, the display portion 204 may be touch sensitive.

FIG. 2A also illustrates a second modular accessory unit 210 with a base 212 and a display unit 214. The modular accessory units 200 and 210 are shown to be separate. FIG. 2B illustrates the modular accessory units 200 and 210 are connected to each other via the bases 202 and 212. Moreover, the display units 204 and 214 are united as a result of the connection. In one implementation, the displays units can act independently and display content as if they are not connected. In another implementation, the display units can act as a single display and display content seamlessly across both spaces as a whole. It should be readily apparent that the present illustration should not be interpreted to be limited by this particular illustrative architecture shown in FIGS. 2A and 2B, and the modular accessory units 200 and 210 represents a generalized illustration and that other elements may be added or the illustrated elements may be removed, modified, or rearranged in many ways. For example, in another implementation, there may be more than two modular accessory units, and additional modular accessory units may be connected to the modular accessory units 200 and 210 via bases. Accordingly, in such implementation, the size of the display unit may also be larger, and each display unit may either act independently or can be combined to act as a single display that presents content seamlessly across the entire surface.

In one implementation, the screen may be bended to various angles. Such form may allow the unit to be used by a plurality of users at the same time. In other implementations, the screen and base may be kept in a linear form or can be used in a curved angle. The curved angle may be provide privacy to the user viewing the screen.

Further, the modular accessory unit may include at least an operation engine, a network engine, window engine, and an application engine. Although the various engines are described as separate engines, in other implementations, the functionality of all or a subset of the engines may be implemented as a single engine. Each of the engines of modular accessory unit may be any suitable combination of hardware and programming to implement the functionalities of the respective engine. Such combinations of hardware and programming may be implemented in a number of different ways. For example, the programming for the engines may be processor executable instructions stored on a non-transitory machine-readable storage medium and the hardware for the engines may include a processing resource to execute those instructions. In such examples, the machine-readable storage medium may store instructions that, when executed by the processing resource, implement the modular accessory unit. The machine-readable storage medium storing the instructions may be integrated in a computing device including the processing resource to execute the instructions, or the machine-readable storage medium may be separate but accessible to the computing device and the processing resource. The processing resource may comprise one processor or multiple processors included in a single computing device or distributed across multiple computing devices. In other examples, the functionalities of any of the engines may be implemented in the form of electronic circuitry.

The operation engine handles an operating system, such as iOS®, Windows®, Android, and any other suitable operating system. The operating system can be multi-user, multiprocessing, multitasking, multithreading, and real-time. In one implementation, the operating system is stored in a memory (e.g., the memory 130 as shown in FIG. 1 performs various tasks related to the use and operation of the display unit 120. Such task may include installation and coordination of the various hardware components of the modular accessory unit, operations relating to instances from various devices in the display, recognizing input from users, such as touch on the display screen, keeping track of files and directories on memory (e.g., the memory 130 as shown in FIG. 1); and managing traffic on bus (e.g., as shown in FIG. 1). The connection engine includes various components for establishing and maintaining device connections, such as computer-readable instructions for implementing communication protocols including TCP/IP, HTTP, Ethernet®, USB®, and FireWire®. The connection engine supports the pairing process between the modular accessory unit and various modular accessory units providing content to be displayed on the merged display unit.

Figure 3:
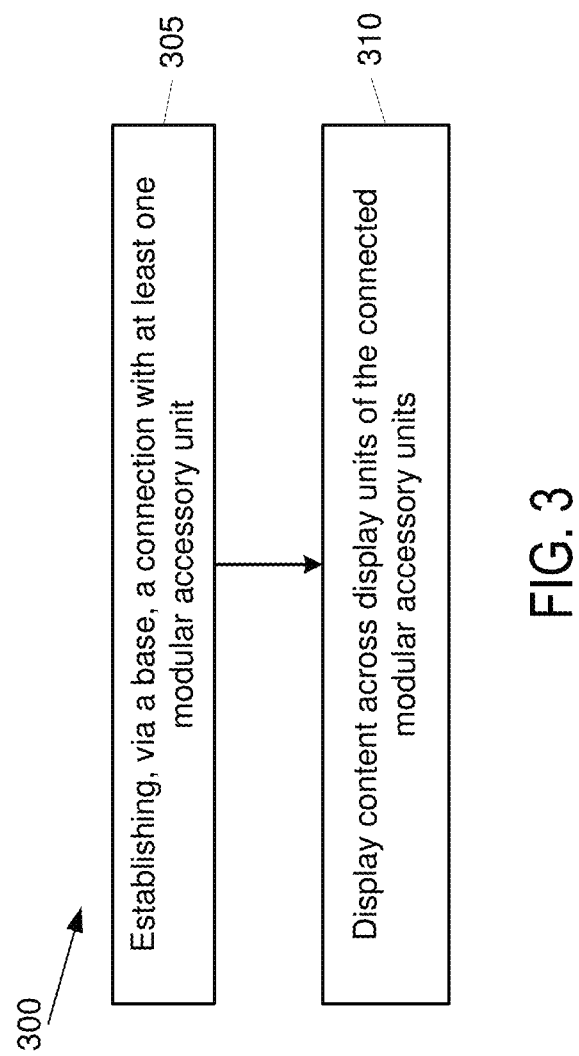
FIG. 3 illustrates an example process flow diagram in accordance with an implementation.

Turning now to the operation of the system 100, FIG. 3 depicts a process flow diagram 300 in accordance with an example implementation. It should be readily apparent that the processes depicted in FIG. 3 represent generalized illustrations, and that other processes may be added or the illustrated processes may be removed, modified, or rearranged in many ways. Further, it should be understood that the processes may represent executable instructions stored on memory that may cause a processing device to respond, to perform actions, to change states, and/or to make decisions, for instance. Thus, the described processes may be implemented as executable instructions and/or operations provided by a memory associated with the computing device 300.

The illustrated process 300 begins at block 305, where a connection is established between the display unit and at least one other display unit through the base. More specifically, a connection is established between a display unit of the modular accessory system and at least one other display unit of another modular accessory system. At block 310, content is displayed seamlessly across the display unit and the at least one other display unit, wherein one portion of the content is displayed on the display unit and the other portion is displayed on the at least one other display unit. In one implementation, the seamless full-screen across multiple display units is managed by an application engine. The application engine may manage interactions between the display units in a way that two or more display units may act as one unit, or two or more display units as individually.

While the above disclosure has been shown and described with reference to the foregoing examples, it should be understood that other forms, details, and implementations may be made without departing from the spirit and scope of the disclosure that is defined in the following claims.

What is claimed is:

1. A modular accessory system comprising:
    a display switchable between a first mode in which the display is bent at a viewing angle or is curved and a second mode in which the display is not bent or is linear and not curved;
    a base, attached to the display, comprising a communication interface to establish a connection between the display of the modular accessory system and a display of a different modular accessory system; and
    a stand attached to the base, wherein the stand holds a power cable to power the modular accessory system,
    wherein in response to switching of the display from the second mode to the first mode, the display functions as a separate display independent of the display of the different modular accessory system with which the display is connected,
    and wherein in response to switching of the display from the first mode to the second mode, the display functions with the display of the different modular accessory system as a single display.

2. The system of claim 1, wherein the modular accessory system is a desk or a table.

3. The system of claim 1, wherein surface of the display is waterproof, scratch proof and heat resistant.

4. The system of claim 1, wherein the display is a touch sensitive screen and detects gesture control.

5. The system of claim 1, wherein the base comprises a processor and a memory storing program code executable by the processor to:
    manage the display;
    manage the communication interface to establish the connection between the display and the display of the different modular accessory system; and
    manage interaction between the display and the display of the different modular accessory system.

6. The system of claim 1, further comprising mechanical and wired electrical mechanisms to connect the modular accessory system to the different modular accessory system.

7. The system of claim 6, wherein the mechanical mechanisms comprise a joint, magnet, latch, or slide.

8. The system of claim 1, wherein the modular accessory system and the different modular accessory system are connected via USB, VGA, HDMI, NFC, Bluetooth or Wi-Fi.

9. The system of claim 1, wherein the power cable is plugged into a power source to enable screen power to the display.

10. The system of claim 1, wherein the modular accessory system has a hinge to allow rotation of the display.

11. A method comprising:
    establishing a connection among a plurality of modular accessory systems that each have a display switchable between a first mode in which the display is bent at a viewing angle or is curved and a second mode in which the display is not bent or is linear and not curved;
    in response to switching of a particular modular accessory system from the second mode to the first mode, operating the display of the particular module accessory system as a separate display independent of the displays of other of the modular accessory systems; and
    in response to switching of the particular modular accessory system from the first mode to the second mode, operating the display of the particular modular accessory system and the display of every other of the modular accessory systems with which the display of the particular modular accessory system is connected as a single display.

12. The method of claim 11, further comprising receiving a touch gesture from a user on any display.

13. A non-transitory computer-readable medium comprising instructions executable by a modular accessory system to:
    establish a connection between a display of the modular accessory system and the display of a different modular accessory system;
    in response to switching of the display of the modular accessory system from a second mode in which the display is not bent or is linear and not curved to a first mode in which the display is bent at a viewing angle or is curved, operate the display as a separate display independent of the display of the different modular accessory system with which the display is connected; and
    in response to switching of the display of the modular accessory system from the first mode to the second mode, operate the display as a single display with the display of the different modular accessory system.

14. The non-transitory computer-readable medium of claim 13, wherein the instructions are executable by the modular accessory system to further:
    receive a touch gesture from a user on the display of the modular accessory system.

\* \* \* \* \*